United States Patent [19]

Kwoka

[11] Patent Number: 4,703,566

[45] Date of Patent: Nov. 3, 1987

[54] COVEYOR FOR VAPOR PHASE REFLOW SYSTEM

[75] Inventor: Mark A. Kwoka, Palm Bay, Fla.

[73] Assignee: Harris Corporation, Melbourne, Fla.

[21] Appl. No.: 798,668

[22] Filed: Nov. 15, 1985

[51] Int. Cl.$^4$ ............................................. F26B 15/18
[52] U.S. Cl. ........................................ 34/78; 34/219;
 34/236; 198/699.1; 198/848
[58] Field of Search ................. 198/699.1, 848; 34/75,
 34/78, 219, 236; 204/54 R, 37.3

[56] References Cited

U.S. PATENT DOCUMENTS 3,253,692  5/1966  Ota ................................... 198/699.1
4,389,797  6/1983  Spigarelli et al. ....................... 34/78

Primary Examiner—Larry I. Schwartz
Attorney, Agent, or Firm—William A. Troner; Thomas N. Twomey; Charles C. Krawczyk

[57] ABSTRACT

The lead finish can be greatly improved on leaded electronic components in a vapor phase reflow process without extra process steps by providing an improved conveyor belt having supports for carrying the components in bug down orientation while preventing the leads from substantially protruding through the plane of the conveyor mechanism and simultaneously allowing for the free flow of the heated vapor through the conveyor belt and on top of the belts such that the leads of the electronic components rest on the tape. The remaining portion of the belt is of a large grid mesh to permit the free flow of vapors in the upper portion of the reflow chamber.

21 Claims, 6 Drawing Figures

COVEYOR FOR VAPOR PHASE REFLOW SYSTEM

FIELD OF THE INVENTION

The present invention relates to semiconductor chip manufacturing and more particularly to the provision of a lead finish on packaged semiconductor devices. The present invention provides an improved conveyance mechanism for transporting packaged semiconductors through a vapor phase reflow system.

BACKGROUND OF THE INVENTION

In the manufacture of semiconductor devices, it is standard practice to coat the leads of packaged devices with a thin layer of a corrosion resistant and aesthetically pleasing coating material. This coating material is commonly referred to as the lead finish. A commonly used lead finish is reflowed tin which is provided by first electrolytically depositing tin onto the leads, commonly called "plating", which results in a matte finish, and then heating the thus coated leads to the tin's melting point. The melting of the tin is referred to as "reflow" and it results in the conversion of the matte finish to a shiny finish.

The reflow process may be conducted in a variety of manners. The particular option of interest in the present invention is known as vapor phase reflow which has become a widely utilized method due to the relative uniformity of quality obtainable in providing a high quality lead finish. This uniformity results from either the batch or continuous mode operations although the continuous, or "in line," systems tend to provide the best uniformity of quality. The invention deals with the in line process.

In its simplest form, an in line process includes a conveyance mechanism for providing movement of a series of packaged chips through a reflow region or chamber. As the chips pass through the reflow chamber the previously plated leads are heated until the tin is melted, at least at its surface, and the matte finish converts to a shiny finish. The chips then are moved from the reflow chamber. The reflow chamber is typically constructed such that a boiling liquid can be held in the bottom of the chamber to establish a liquid/vapor equilibrium within the chamber and thus insure maintenance of a constant temperature.

In the ideal arrangement, the duration of the chips' passage through the reflow chamber is carefully timed such that reflow occurs immediately prior to the chips exit from the chamber. In practice, however, it has not been possible to consistently attain this theoretical optimum timing. As a result of the unavoidable variations in process parameters, albeit within fairly close tolerances, it has been necessary to insure that all chip leads obtain the desired reflow by designing the system such that the chip remains in the chamber longer than the theoretical minimum and long enough to statistically insure reflow on all leads. As a result, most of the leads not only reach the point where the surface become shiny, but also reach the point where the tin begins to flow from the leads. This phenomenon is referred to as tin "run off".

The conveyor mechanism which transports the chips through the reflow chamber is designed to permit free vapor flow around the leads in order that a good heat exchange may occur and the reflow thus may uniformly be achieved. FIG. 1 illustrates the typical arrangement wherein the reflow chamber 10 has a boiling liquid 12 in the lower portion and hot vapor 14 in equilibrium over the boiling liquid. A conveyor belt 50 is arranged to pass through portals 11a, 11b such that the belt 50 passes through the vapor contained in the upper portion of the reflow chamber. In an effort to provide minimum restriction of vapor circulation, the conveyor belt is constructed of an open grid mesh. The mesh may be made for instance of fiberglass strands coated with a non-stick coating such as Teflon. The open grid mesh may typically have four strands per inch to allow sufficient vapor flow. With such an open grid mesh, it is necessary to place the chips on the conveyor belt in a "bug up" orientation. That is, the leads point up and the package "top" is placed down on the belt. If the chips are placed on the belt "bug down", the leads penetrate the mesh, making contact with the mesh support and inlet and exit throats along the entire length of the machine. As the belt rounds the roller 16, the leads protruding through the belt can be bent or broken and frequently the presence of the protruding leads will cause jamming of the belt operation at the support and throat seams and joints. Also, visual blemishes on reflowed leads can occur due to contact of the lead surface with the belt mesh during reflow.

While the bug up arrangement has been required as a result of the need for an open mesh, it has been found that the bug up process produces a very thin reflowed coating due to the amount of tin run off which occurs in this arrangement. It has been discovered that a thicker reflowed tin layer can be provided by the process of the invention without interfering with the movement of the conveyor belt or creating optical blemishes. The thicker reflowed tin layer results in higher quality finished leads with improved solderability.

While it has been discovered that a bug down process provides better quality finished leads, it is to be noted that the mere adoption of a bug down arrangement is not sufficient. It is also necessary to provide for the free circulation of vapor throughout the chamber. Thus, a solid belt would be unacceptable in this regard. Use of a mesh of sufficiently smaller grid would restrict vapor flow less than a solid belt and might be able to support the chip without damaging the leads or interfering with belt rotation. However, the greater number of strands and the increase in the number of strand intersections would provide a proportionately greater surface area and an increase in the number of intersection locations where the reflow fluid would collect and be removed from the chamber. This removal of the reflow material from the chamber is known as "dragout". It is noted that the use of a solid belt would also be subject to increased drag out relative to the open mesh belt used in bug up systems. Because of the expense of maintaining the reflow chamber's fluid level, it is desirable to avoid excessive dragout of the reflow material.

Thus, it is an object of the present invention to provide an improved vapor phase tin reflow system wherein a chip can be conveyed bug down through the reflow chamber without interfering with the system operation.

It is also an object of the present invention to provide such a system which does not create any visually evident damage to the reflowed tin on the leads and does not structurally damage the leads.

It is another object of the present invention to provide this improved system without causing excessive dragout of the reflow material and without substantially reducing the circulation of the reflow vapor in the upper portion of the reflow chamber.

SUMMARY OF THE INVENTION

The foregoing objectives are met by the present invention which is primarily based on the provision of a novel conveyor configuration as shown in FIG. 3. The open mesh screen 100 which forms the conveyor belt 50 of FIG. 1 has teflon tape strips 101a, 101b fused into the screen 100 such that the leads of a chip can be placed on the tape. Placement of the leads on the tape avoids any interference with the rotation of the belt and provides an arrangement where the sides of the leads are not in contact with the web thereby avoiding the creation of contact originated optical blemishes. Also, since the leads are not protruding below the screen, the leads are not caught between the rollers and the conveyor belt and the potential for bending or breaking of the leads is obviated. This is all done without providing a structure which would be prone to excessive dragout of the reflow material and the free circulation of the reflow vapor is still permitted through the unobstructed portions of the open mesh grid conveyor belt.

DETAILED DESCRIPTION OF THE INVENTION

Figure 1:
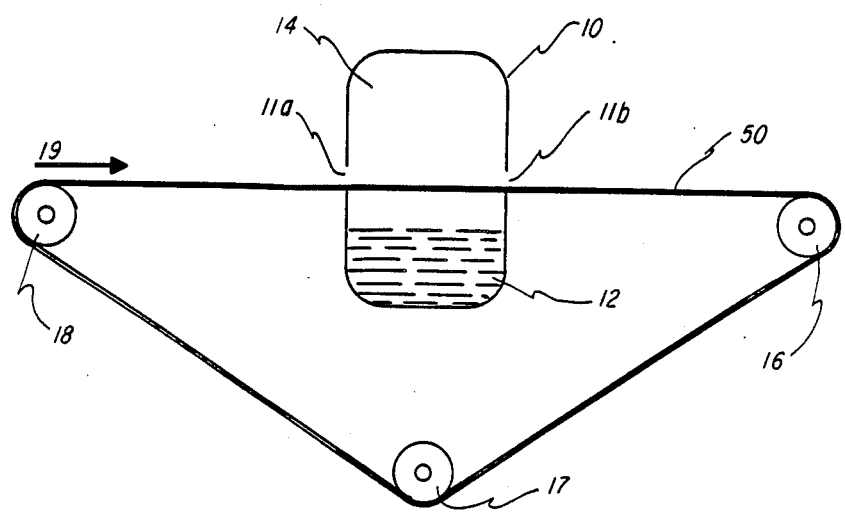
FIG. 1 is an illustration of the functional components of a typical vapor phase reflow arrangement.

The subject invention will now be described with reference to the accompanying drawings wherein FIG. 1 illustrates the environment of the improved conveyor for tin reflow of the present invention. The reflow chamber 10 has an inlet portal 11a and a exit portal 11b. The conveyor belt 50 is a continuous loop belt which revolves around rollers 16, 17 and 18. The lower portion of chamber 10 includes a liquid which is heated to its boiling temperature and the upper portion of the chamber 10 is filled with vapors 14 of the boiling liquid 12. The objective of this reflow chamber is to maintain a constant temperature and an active vapor turbulence in the upper portion of the chamber. The temperature is maintained by creating an equilibrium between the boiling liquid and the vapor. A typical liquid 12 would be FC-71 which is a fluorinated hydrocarbon having a boiling temperature of 251° C. By rapidly boiling the liquid 12, a turbulent vapor flow is established in the upper portion of the chamber 10.

Figure 2:
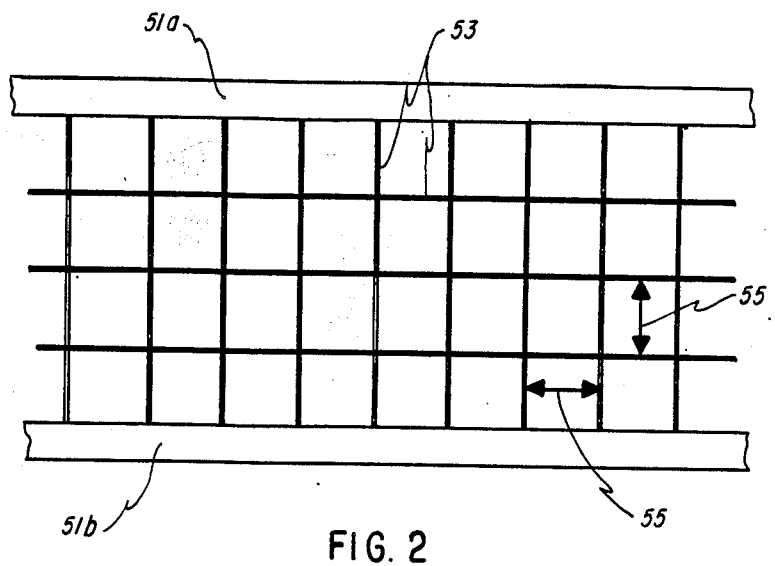
FIG. 2 is an illustration of an open mesh screen type conveyor belt which is used in a typical bug up configuration vapor phase reflow arrangement.

The conveyor belt 50 revolves in the direction shown by arrow 19 such that the motion of the belt enters portal 11a and exits portal 11b. The belt is generally of the type shown in FIG. 2 wherein a Teflon tape 51a, 51b is provided at each edge of the conveyor belt to provide a relatively strong edge portion of the belt. Strands 53 of, for instance, fiberglass coated with Teflon are provided to form a web having sufficient strength to support electronic components which may be laid on the web. The spacing between strands, in this case parallel strands, should be sufficient to allow for the free flow of vapor through the grid. In a typical environment this would provide a grid dimension 55 of approximately ¼ inch, provided that the strands have about a 0.040 inch diameter. Strands having this dimension and constituency are extremely durable and are sufficiently strong to support the electronic components which are to be carried by the conveyor belt.

In operation, the conveyor belt 50 is moved at a velocity of approximately 115 inches per minute with a tolerance of plus or minus two inches per minute. The strength of the fiberglass strands and the wear and corrosion resistant Teflon coating will provide for sufficient durability for the belt to easily traverse rollers 16, 17 and 18 without undue wear. It is further noted that conveyor belts made of fiberglass strands coated with Teflon can withstand temperatures exceeding 300° C. In a typical arrangement the length of the continuous loop conveyor belt may be 32 feet and the width of the belt approximately 7¾ inches. With the above-mentioned belt velocity, a particular point on the belt traverses the reflow chamber in approximately 15 seconds. The grid dimension 55 is sufficiently large to allow free turbulent flow of the vapor 14 through the web of the conveyor belt so that the desired liquid/vapor equilibrium may be maintained. Preferably, the grid dimension or center to center distance between adjacent parallel strands of the belt is at least 3/16 of an inch.

Figure 4:
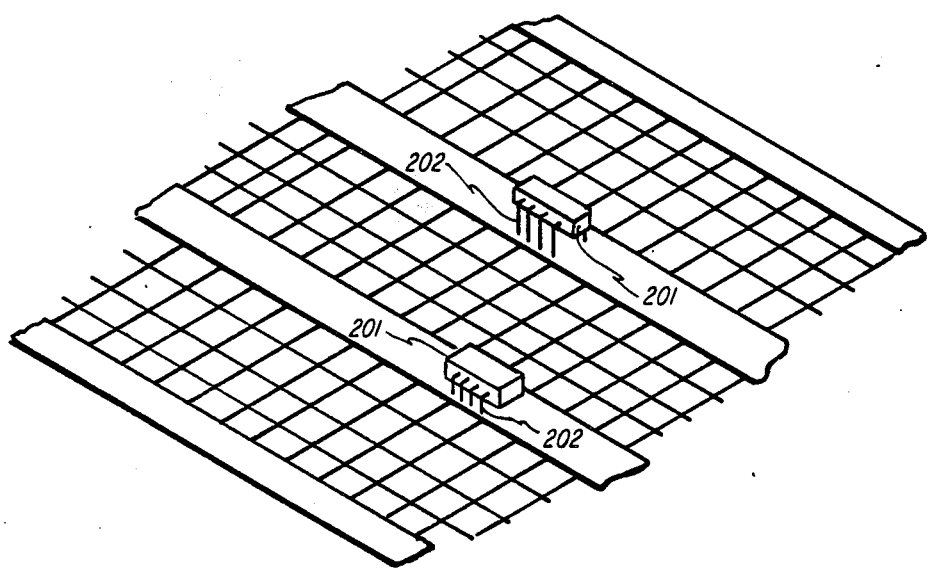
FIGS. 4 and 5 are illustrations of alternative embodiments of the invention.

In order to achieve the objectives of the invention, two strips of parallel Teflon tape 101a, 101b are applied to the conveyor belt in parallel such that the tape 101a, 101b runs along the full length of the continuous loop belt. The width of each strand of tape is small relative to the total width of the conveyor belt in order that there is still ample space through the belt for the free flow of vapor 14. The dimension of each piece of tape is sufficient to support a leaded electronic component 201 in bug down orientation as shown in FIG. 4 where the leads 202 stand on top of the tape. In a preferred embodiment there is a separation of at least one and one half inches or more between the parallel strips. However, it will generally allow sufficient vapor flow between the adjacent strips of tape if there is a separation of at least one half of an inch.

Figure 3:
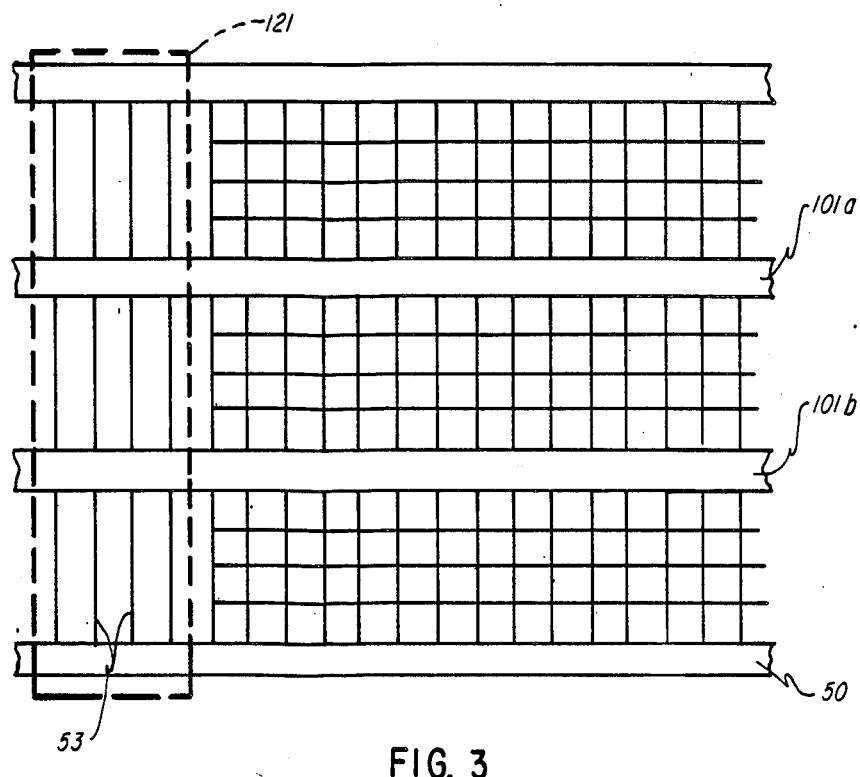
FIG. 3 is an illustration of the improved conveyor belt of the present invention.
Figure 5:
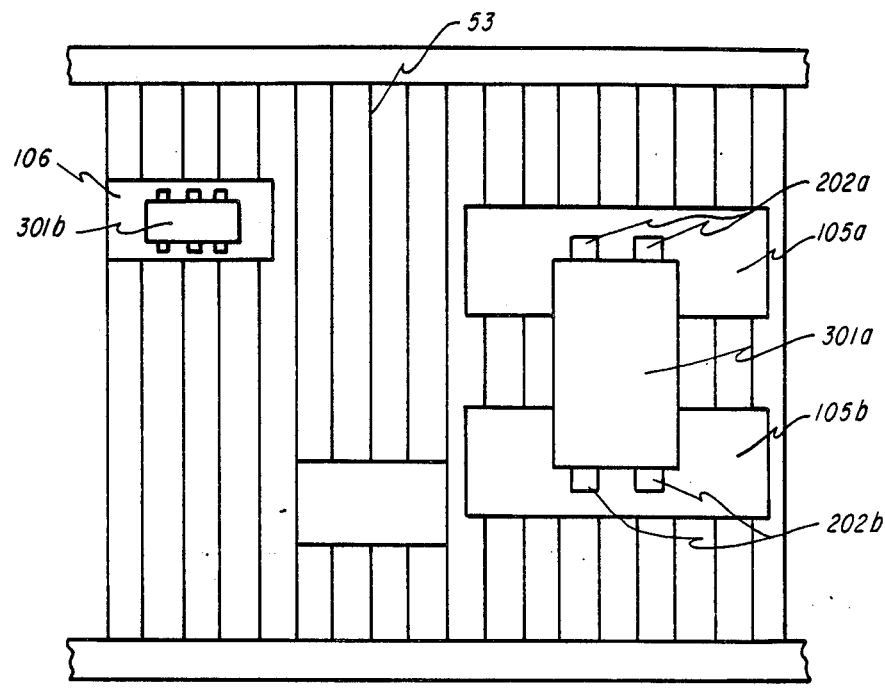

An alternative arrangement is illustrated in FIG. 5 wherein discrete support portions 105a, 105b may be provided for supporting sets of leads 202a, 202b in a manner such that the component 201 is supported by more than one support region. It is also possible to provide individual chips such as 301b on individual support regions 106. An advantage of the arrangement shown in FIG. 5 wherein a relatively large component 301a may be supported by a plurality of support regions is that additional vapor flow may be permitted between the individual support regions such that increased vapor flow around the leads 202a, 202b may be facilitated. It is also noted that in FIG. 5 the strands 53 run only in one direction and do not form a grid as in the illustration in FIG. 3. This will reduce the total surface area of strands provided in the structure. In a preferred embodiment each of the pads 105a, 105b, 106 is made of Teflon tape which is fused into the strands 53 which make up the conveyor belt. The fusing of the Teflon tape into the strands may be accomplished by heating the teflon to slightly below its melting temperature and mechanically pressing the tape into the strands to thereby heat-press the tape into the open mesh belt. Use of an unsintered teflon tape yields good results. In this manner it is possible to insure that the leads of the electronic components do not protrude substantially below the plane of the conveyor belt. It is noted that the weight of the electronic components may result in some depression of the Teflon tape hence resulting in an insubstantial extension of the leads below the plane of the conveyor belt but this is not considered to be critical due to the presence of the tape beneath the leads which will tend to protect the leads in the event that the electronic components are not removed from the belt prior to the time that they reach roller 16. The presence of the tape will cause the components to rise above the roller and will prevent the leads from becoming wedged between a strand 53 and the roller surface. Of course, in an optimized arrangement, there is no protrusion below the belt due to the strength and rigidity of the support portion of the belt relative to the weight of the electronic components. Referring again to FIG. 3, the portion of tape 101a, 101b enclosed in the dashed rectangle 121, shows a modified version of the conveyor belt wherein strands 53 run in only one direction while the tape 101a, 101b runs perpendicular to the support strands 53. This arrangement optimizes the reduction in surface area of support strands since the tape will provide structural integrity in one dimension while the strands 53 provide the structural integrity in the other direction. As described previously, the reduction in surface area will result in improved system performance due to the reduction in dragout which is dependent upon the total surface area of the belt as it exits the chamber 10.

Figure 6:
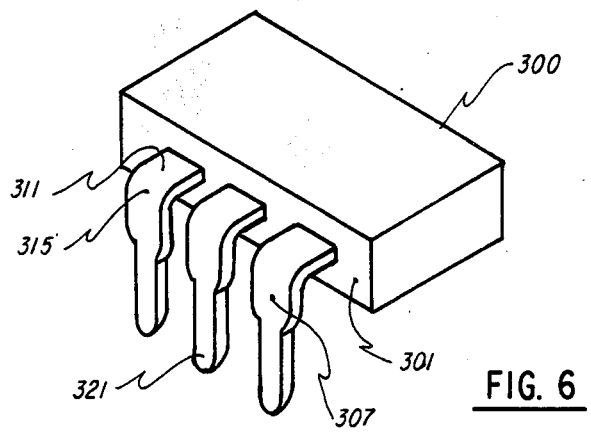
FIG. 6 is an illustration of a leaded chip.

In operation, the electronic components contain conductive leads which are coated with a conductive coating which has been previously applied for instance, by electrolytically depositing or plating a layer of tin on the leads. Such an initial application of tin results in the creation of a matte finish. This layer of tin is of relatively uniform thickness over the entire exposed portion of the lead which as shown in FIG. 6 extends from the side 301 of the electronic component 300. The first lead 307 includes a shoulder portion 311 which extends perpendicular to the side 301 of the component 300. The lead is bent in a downward direction at the edge 315 of shoulder portion 311. As a result, the flat 321 of the lead extends in a downward direction. The flat 321 is the portion of the lead where electrical contact is generally made to the remaining portions of an electrical circuit in which electronic component 300 is incorporated. It is thus important that the plating of tin be thorough on the flat of the lead. In a typical application it is desirable to have a finished tin thickness exceeding 200 microinches and it would be preferable if a thickness of 400 microinches or more could be attained. In the process of the present invention, it is possible to assure that tin thickness following reflow exceeds 200 microinches and typically is approximately 400 microinches. This improved tin reflow thickness is a result of placing the electronic component in the bug down orientation. The reason this orientation provides improvement is that upon heating of the tin to its reflow temperature in a bug up orientation, the tin tends to run downhill resulting in accumulation of the flowing tin at the shoulder 311 of the lead. However, in a bug down orientation any tin which flows actually flows toward the flat and results in increased rather than decreased tin coverage at the critical flat of the lead.

In addition to the benefits of providing a viable arrangement for tin reflow in a bug down orientation, the present invention additionally alleviates excessive drag out of the boiling liquid, in this case FC-71, associated with alternative arrangements.

While the present invention has been described with reference to various specific implementations it is to be understood that modifications or variations evident to those of ordinary skill in the art are intended to be covered by the present patent and the appended claims are to be interpreted with this in mind.

What is claimed is:

1. An improvement in an open mesh belt of the type used to convey electronic components through a vapor phase reflow system, said electronic components having a plurality of leads, said improvement comprising:
providing at least one-continuous strip of Teflon tape on said open mesh belt to support said electronic component in a bug down orientation such that the leads of said electronic components are directly supported by said Teflon tape.

2. An improved vapor phase reflow arrangement comprising:
a vapor phase reflow chamber;
a conveyor means for transporting chips having leads through said vapor phase reflow chamber;
said conveyor means comprising;
an array of support strands, and
a pad for supporting said chips in bug down orientation, wherein said leads are supported directly by said supporting means such that said leads do not substantially extend below said support strands;
and wherein said pad for supporting said chips is supported by said support strands.

3. An improved vapor phase reflow arrangement as claimed in claim 2 wherein said array of support strands comprises a screen having a grid dimension of about ¼ inch, said screen forming a continuous loop conveyor belt.

4. An improved vapor phase reflow arrangement as claimed in claim 3 wherein said pad comprises a continuous strip of Teflon tape secured to said screen.

5. An improved vapor phase reflow arrangement as claimed in claim 3 wherein said pad further comprises at least one additional pad wherein each said pad comprises a discrete strip of Teflon tape secured to said screen.

6. An improved vapor phase reflow arrangement as claimed in claim 4 wherein said Teflon tape is heat pressed into said continuous loop conveyor belt.

7. An improved vapor phase reflow arrangement as claimed in claim 5 wherein said Teflon tape is heat pressed into said continuous loop conveyor belt.

8. An improved vapor phase reflow arrangement as claimed in claim 7 wherein said plurality of discrete strips of Teflon tape are laid in parallel.

9. An improved vapor phase reflow arrangement as claimed in claim 8 wherein said parallel strips are spaced by at least one half of an inch.

10. In a vapor phase reflow arrangement of the type comprising a reflow chamber and an open mesh conveyor means for continuous transport of electrical components having leads through said reflow chamber for the vapor phase reflow of a matte layer on said leads, the improvement comprising:
bug down support means adapted to directly support said leads of such electronic components, wherein said bug down support means is arranged on said open mesh conveyor means such that said leads are substantially supported above the conveyor means wherein said bug support means comprises a pad.

11. A vapor phase reflow arrangement as claimed in claim 10 wherein said pad comprises a strip of Teflon tape carried on said conveyor means.

12. A vapor phase reflow arrangement as claimed in claim 11 wherein said conveyor means comprises an open grid mesh of Teflon coated fiberglass threads.

13. A vapor phase reflow arrangement as claimed in claim 12 wherein said open grid mesh has a grid dimension exceeding 3/16 of an inch.

14. A vapor reflow arrangement as claimed in claim 10 wherein said electrical components are packaged semiconductor chips.

15. A vapor reflow arrangement as claimed in claim 10 wherein said matte layer is electrolytically deposited.

16. A vapor reflow arrangement as claimed in claim 15 wherein said matte layer is of tin.

17. A vapor reflow arrangement as claimed in claim 16 wherein said pad comprises a strip of Teflon tape carried on said conveyor means.

18. A vapor reflow arrangement as claimed in claim 17 wherein said conveyor means comprises a large grid mesh of Teflon coated fiberglass threads.

19. A vapor reflow arrangement as claimed in claim 18 wherein said electrical components are packaged semiconductor chips.

20. A vapor reflow arrangement as claimed in claim 15 wherein said matte layer is of a material selected from the group consisting of tin, tin-lead, tin alloys and tin mixtures.

21. An improved vapor reflow arrangement comprising:
 a vapor phase reflow chamber; and
 an open mesh conveyor belt for transporting chips having a plurality of leads in bug down orientation through said vapor phase reflow chamber, said open mesh conveyor belt including a pad fused into said open mesh conveyor belt for supporting said chips wherein said leads are supported on said pad such that said leads do not substantially extend below said conveyor belt.

* * * * *